United States Patent
Yamamoto et al.

(10) Patent No.: US 8,698,310 B2
(45) Date of Patent: Apr. 15, 2014

(54) STRUCTURE FOR SIGNAL LINE, MANUFACTURING METHOD FOR SIGNAL LINE AND SWITCH USING THE SIGNAL LINE

(75) Inventors: Junya Yamamoto, Shiga (JP); Koji Narise, Kyoto (JP)

(73) Assignee: OMRON Corporation, Kyoto-shi, Kyoto (JP)

( * ) Notice: Subject to any disclaimer, the term of this patent is extended or adjusted under 35 U.S.C. 154(b) by 0 days.

(21) Appl. No.: 13/580,391

(22) PCT Filed: Dec. 9, 2010

(86) PCT No.: PCT/JP2010/072110
§ 371 (c)(1),
(2), (4) Date: Nov. 2, 2012

(87) PCT Pub. No.: WO2011/111274
PCT Pub. Date: Sep. 15, 2011

(65) Prior Publication Data
US 2013/0048480 A1 Feb. 28, 2013

(30) Foreign Application Priority Data
Mar. 12, 2010 (JP) ................. 2010-056731

(51) Int. Cl.
*H01L 21/762* (2006.01)
(52) U.S. Cl.
USPC ............ 257/737; 257/E21.499; 257/E23.011; 438/381
(58) Field of Classification Search
USPC .................. 257/E21.499, 737, E23.011, 664, 257/E23.01, 659; 438/381
See application file for complete search history.

(56) References Cited

U.S. PATENT DOCUMENTS

| 6,876,030 B2 * | 4/2005 | Uchiyama et al. ............ 257/314 |
| 2003/0030096 A1 * | 2/2003 | Hsu .............................. 257/314 |

FOREIGN PATENT DOCUMENTS

| JP | 538894 U | 5/1993 |
| JP | 9-246814 A | 9/1997 |

OTHER PUBLICATIONS

Examination Report Issued in Japanese Application No. 2010056731, Dated: Jun. 25, 2013 (8 Pages With English Translation).
Ono, M., et al. "L-Band On-Chip Matching Si-MMIC Low Noise Amplifier Fabricated in SOI SMOS Process", Information Texhnology R&D Center, Kanagawa, Japan (19 Pages With English Translation).
International Search Report w/translation from PCT/JP2010/072110 mailed Feb. 1, 2011 (2 pages).

* cited by examiner

*Primary Examiner* — Zandra Smith
*Assistant Examiner* — Paul Patton
(74) *Attorney, Agent, or Firm* — Osha Liang LLP

(57) ABSTRACT

A structure for a signal line has the signal line having a base, a lower insulating layer formed at an upper surface of the base, a semiconductor layer disposed along a pathway at an upper surface of the lower insulating layer, at least a part of the semiconductor layer configured to transmit a signal, an upper insulating layer formed at an upper surface of the semiconductor layer, at least a part of the upper insulating layer being mounted along the semiconductor layer; and a strip conductor formed at an upper surface of the upper insulating layer, at least a part of the strip conductor being mounted along the upper insulating layer.

3 Claims, 13 Drawing Sheets

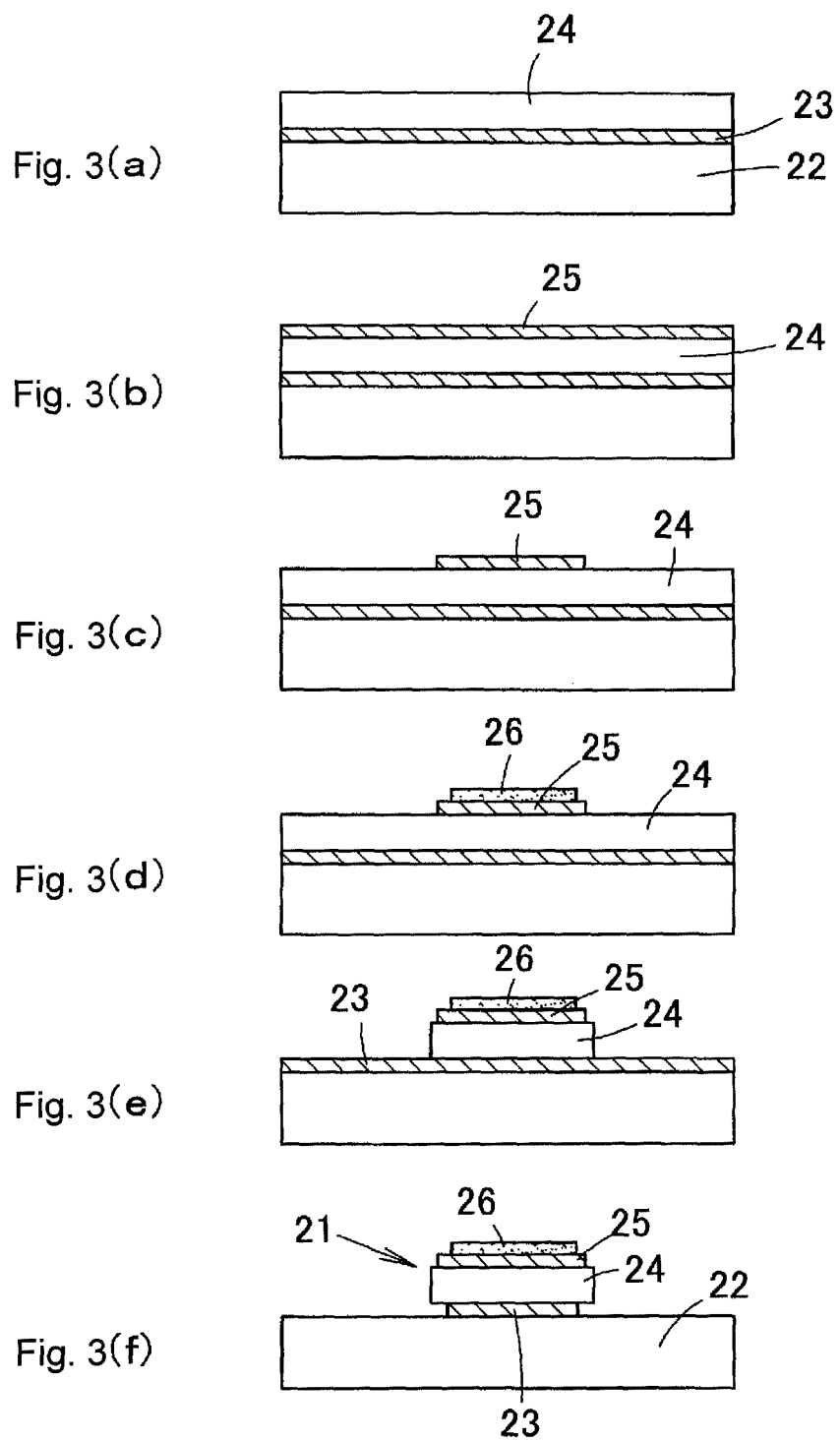

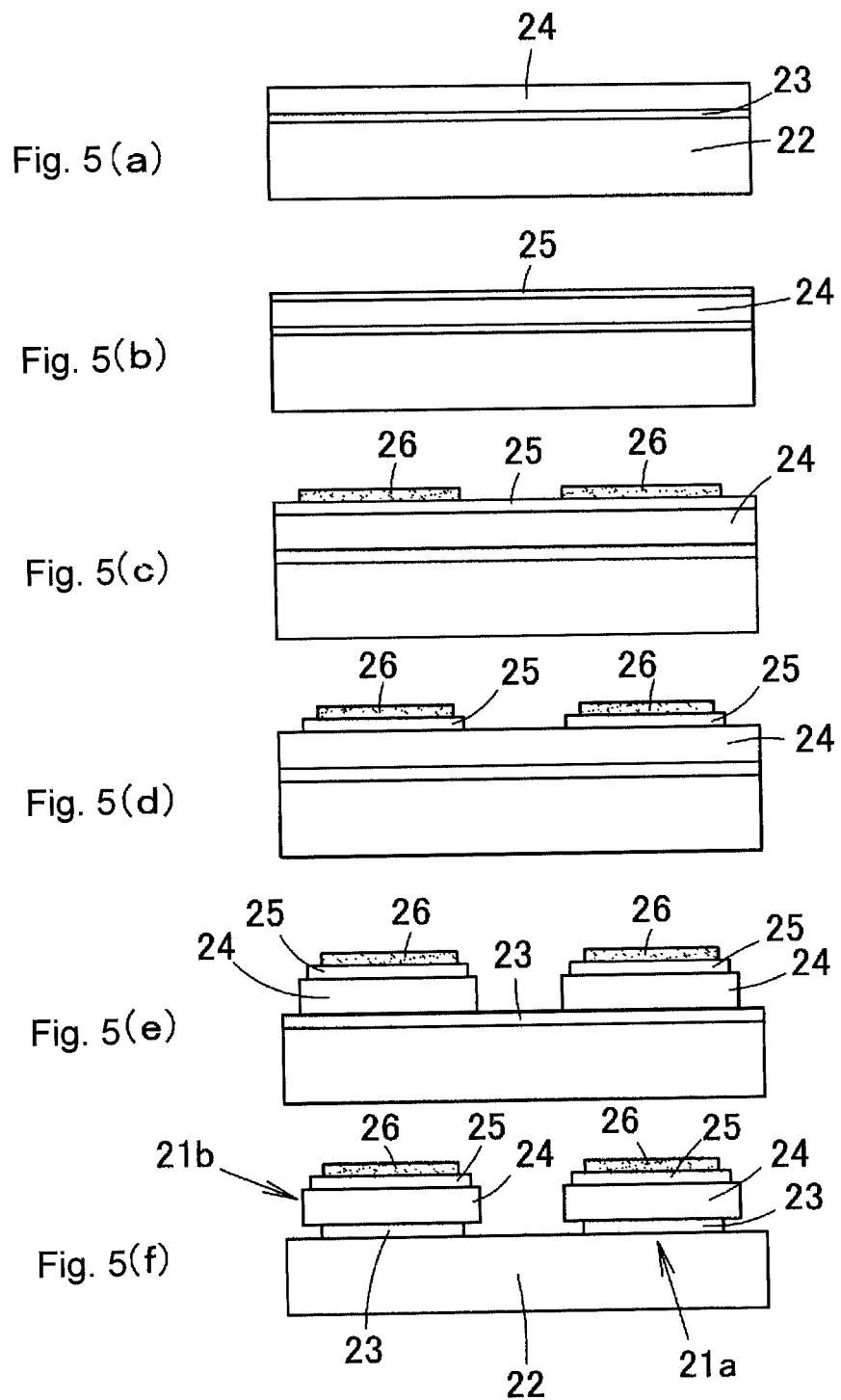

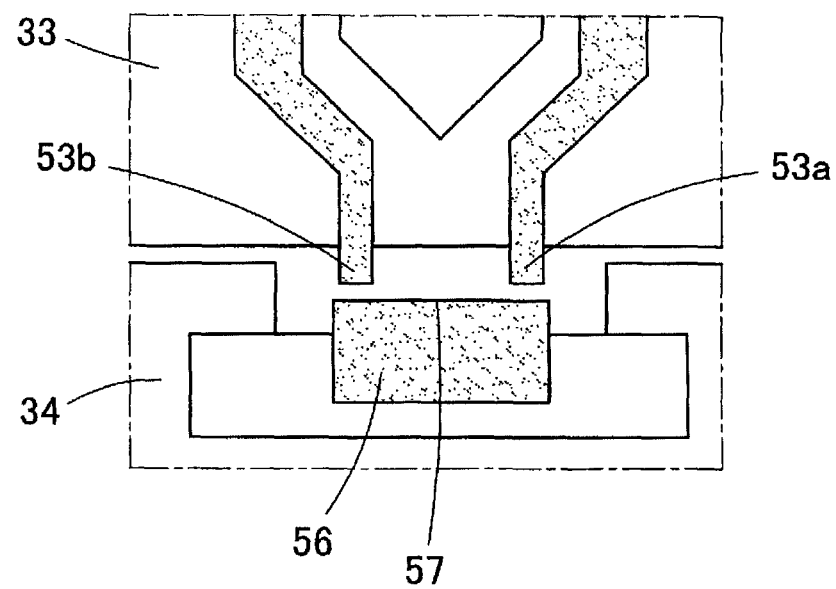
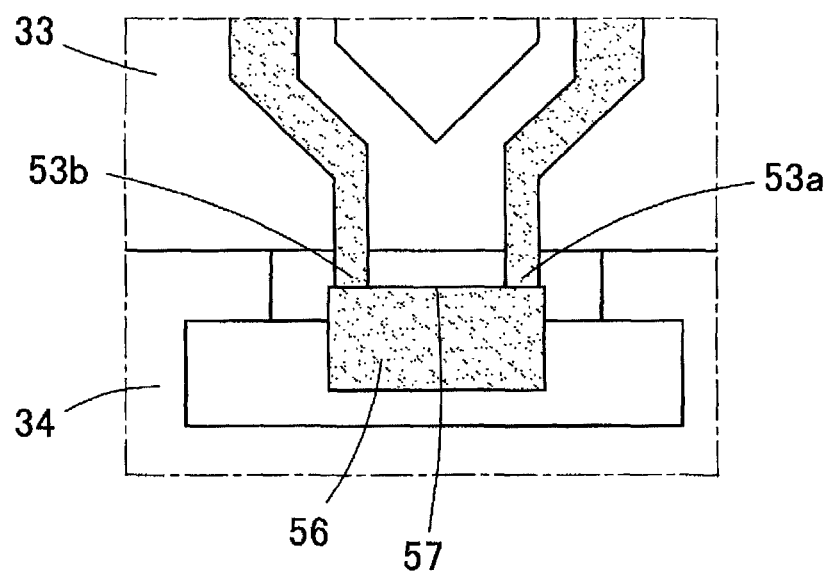

STRUCTURE FOR SIGNAL LINE, MANUFACTURING METHOD FOR SIGNAL LINE AND SWITCH USING THE SIGNAL LINE

TECHNICAL FIELD

The present invention relates to a structure for a high frequency signal line, and more particularly, to a structure for a signal line for use in an MEMS device or the like. Moreover, the present invention relates to a manufacturing method for the signal line and a switch using the signal line.

BACKGROUND ART

In a high frequency signal line for use in an MEMS device or the like, an insulating layer is generally formed along a part of a semiconductor layer having the device formed thereon (i.e., a region serving as a signal line), and then, a strip conductor is mounted on the insulating layer. As a consequence, the width of such a semiconductor layer is sufficiently greater than the line width of the strip conductor, and therefore, the semiconductor layer uses a substrate having a larger area.

However, when, for example, two signal lines for a common semiconductor layer are wired in parallel to each other on the common semiconductor layer in the case where the signal lines are wired in proximity with and in parallel to each other, electromagnetic coupling occurs between the two signal lines through the semiconductor layer. When the electromagnetic coupling occurs between the two signal lines, their high frequency transmission signals are mixed to generate noise or a crosstalk, or may be leaked, thereby resulting in larger transmission loss. In addition, since an electromagnetic field generated around the signal lines is enlarged inside of the semiconductor layer, electromagnetic coupling may occur between the signal line and another device, which is arranged in the vicinity of the signal line. The occurrence of such electromagnetic coupling induces a leak of a high frequency signal that is transmitted through the signal line, thereby increasing a transmission loss.

Patent Document 1 discloses a method for reducing the above-described transmission loss in a signal line. As shown in FIG. 1, a microstrip line is formed by mouting a strip conductor 13 on a dielectric board 12 having a ground conductor 11 formed at the reverse thereof, and further, grooves 14 are formed in the dielectric board 12 along and near both side ends of the lower surface of the strip conductor 13.

An electric field is concentrated at both side ends of the lower surface of the strip conductor 13 in a microstrip line not having any grooves 14. In view of this, the grooves 14 are formed in the vicinity of both side ends of the lower surface of the strip conductor 13 in the microstrip line disclosed in Patent Document 1, therefore, a medium in the vicinity of both side ends of the lower surface of the strip conductor 13 is changed from a dielectric material (the dielectric board 12) to air having a permittivity of 1. In this manner, the concentration of the electric field is alleviated in the vicinity of both side ends of the lower surface of the strip conductor 13, so that a transmission loss is reduced.

However, in the case where metal wiring is formed on the insulating layer (an insulating coating film) formed on the surface of the semiconductor layer, no effect can be expected by forming the grooves on the insulating layer since the insulating layer is very thin. Therefore, the structure disclosed in Patent Document 1 in which the grooves are formed on the dielectric board provided with the strip conductor thereon cannot be adopted.

Patent Document 1: Japanese Unexamined Patent Publication No. 09-246814

SUMMARY

One or more embodiments of the present invention provides a structure for a signal line capable of reducing a leak of a signal in the signal line having a strip conductor on an insulating layer formed on a surface of a semiconductor layer and a switch using the signal line.

In a structure for a signal line according to one or more embodiments of the present invention, the signal line includes: a base; a lower insulating layer formed at an upper surface of the base; a semiconductor layer disposed along a pathway at an upper surface of the lower insulating layer, at least a part of the semiconductor layer intending to transmit a signal; an upper insulating layer formed at an upper surface of the semiconductor layer, at least a part of the upper insulating layer being mounted along the semiconductor layer; and a strip conductor formed at an upper surface of the upper insulating layer, at least a part of the strip conductor being mounted along the upper insulating layer. Here, a ground conductor or a semiconductor may be used as the base (that is not always needed to be grounded).

With the structure for the signal line according to one or more embodiments of the present invention, an electromagnetic field passing through the semiconductor layer can be reduced, and therefore, a loss between the strip line and the base can be reduced. As a consequence, a leak transmitted through the semiconductor layer can be reduced. Therefore, as long as at least a part of the signal line is configured in the structure for the signal line according to one or more embodiments of the present invention, the leak from the signal line can be reduced, so that isolation characteristics of each of the signal lines become excellent, further, an insertion loss can be reduced.

According to one or more embodiments of the present invention, in the structure for the signal line, a plurality of signal lines, each having the lower insulating layer, the semiconductor layer, the upper insulating layer, and the strip conductor, are mounted on the base that is commonly used, and in the plurality of signal lines, at least parts of the semiconductor layers are separated from each other; at least parts of the upper insulating layers are separated from each other; and at least parts of the strip conductors are separated from each other. The lower insulating layers may be continuous or separated as a whole, or may be partly continuous and partly separated. In the above embodiments, each of the signal lines can be formed into an island, and therefore, the leak of the signal between the signal lines can be reduced. Therefore, it is possible to make the isolation characteristics of each of the signal lines excellent, and further, to reduce an insertion loss.

A manufacturing method for a signal line according to one or more embodiments of the present invention includes the steps of: forming a second insulating layer at an upper surface of a second semiconductor substrate in an SOI substrate in which a first semiconductor substrate and the second semiconductor substrate are welded while holding a first insulating layer therebetween; patterning the second insulating layer in a band manner to form an upper insulating layer for a signal line; manufacturing a strip conductor for a signal line along the upper insulating layer at an upper surface of the upper insulating layer; etching and removing the second semiconductor substrate in a region exposed to the outside from the upper insulating layer to form a semiconductor layer for a signal line with the second semiconductor substrate; and etching and removing the first insulating layer in a region exposed to the outside from the semiconductor layer to form a lower insulating layer for a signal line with the first insulating layer at an upper surface of a base for the signal line including the first semiconductor substrate.

With the manufacturing method for a signal line according to one or more embodiments of the present invention, the signal line can be manufactured in a fewer steps by using an SOI substrate.

A switch according to one or more embodiments of the present invention includes the structure for the signal line used as at least one pair of contacts that are brought into contact with or separated from each other and at least a part of a pathway for a signal flowing in the contacts. With the switch according to one or more embodiments of the present invention, it is possible to reduce a leak of a high frequency signal from a wired section serving as a pathway for the signal, to make the isolation characteristics of each of the signal lines excellent, and to reduce the insertion loss.

BRIEF DESCRIPTION OF THE DRAWINGS

FIGS. 3A to 3F are cross-sectional views schematically showing a manufacturing process for the signal line shown in FIGS. 2A and 2B.

FIGS. 5A to 5F are cross-sectional views schematically showing a manufacturing process for the signal line shown in FIGS. 4A and 4B.

FIG. 13A is a view particularly showing the state of the switch off in the example according to one or more embodiments of the present invention and the comparative example.

FIG. 13B is a view particularly showing the state of the switch on in the example according to one or more embodiments of the present invention and the comparative example.

DETAILED DESCRIPTION

Descriptions will be given below of embodiments of the present invention with reference to the attached drawings. Here, the present invention is not limited to the embodiments described below, but is applicable to other usages, and further, can be variously modified in design within the scope not departing from a scope of the present invention. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.
(Single Signal Line)

Figure 1:
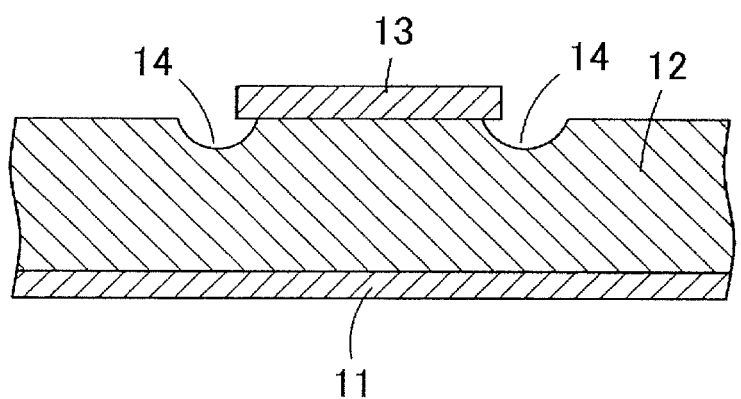
FIG. 1 is a cross-sectional view showing a structure for a high frequency transmission line disclosed in Patent Document 1.
Figure 2A:
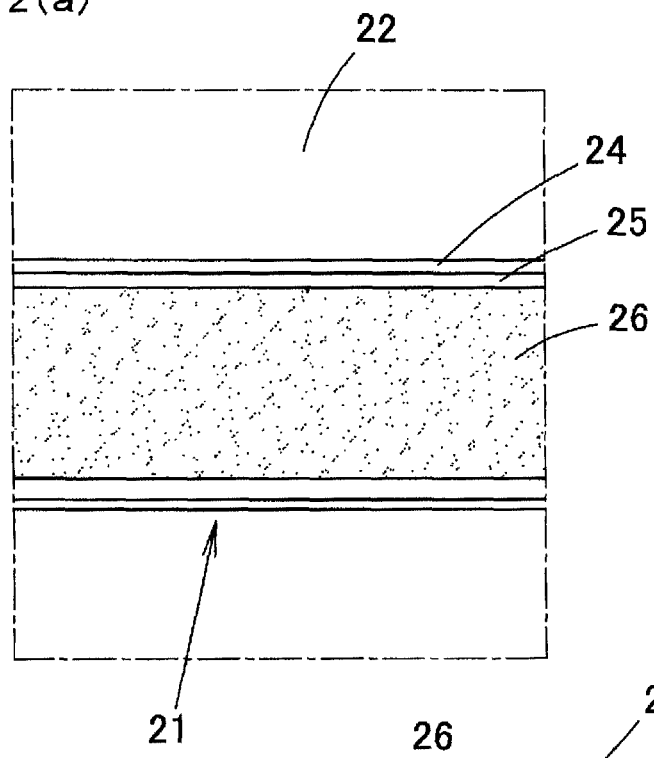
FIG. 2A is a plan view partly showing a signal line according to one or more embodiments of the present invention.
Figure 2B:
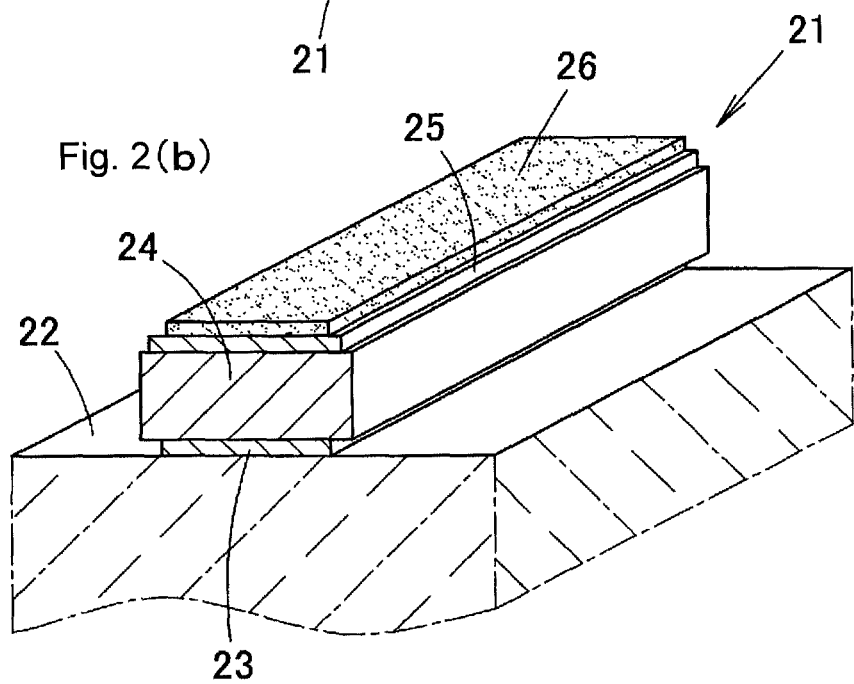
FIG. 2B is a perspective view showing the signal line according to one or more embodiments of the present invention.

FIGS. 2A and 2B are a plan view and a perspective view, respectively, showing a signal line according to one or more embodiments of the present invention. The signal line 21 represents one signal line for use in an MEMS device or the like. In the signal line 21, a lower insulating layer 23, a semiconductor layer 24, and an upper insulating layer 25 are laminated on a base 22, and further, a strip conductor 26 is wired on the upper surface of the upper insulating layer 25.

The base 22 is a layer or a substrate made of a semiconductor such as Si or highly resistant Si or metal, and then, is grounded via a circuit board, as necessary. The semiconductor layer 24 has an insulating property or a semi-insulating property, and further, is a substrate made of highly resistant Si. The lower insulating layer 23 and the upper insulating layer 25 are made of an oxide film ($SiO_2$) or a nitride film (SiN). The strip conductor 26 is a belt-like metal conductor layer having a dual structure including, for example, a Cr lower layer and an Au upper layer. Alternatively, the strip conductor 26 may be made of Pt, Au, Pd, Ir, Ru, Rh, Re, Ta, a Pt alloy, or an Au alloy.

The signal line 21 has a line width of, for example, about several tens μm, and is wired along a signal transmission pathway. Moreover, the signal line 21 is formed into an island. The lower insulating layer 23, the semiconductor layer 24, and the upper insulating layer 25 have substantially the same width as that of the strip conductor 26. In the signal line 21 shown in FIGS. 2A and 2B, the width of the upper insulating layer 25 is slightly greater than that of the strip conductor 26, and further, the widths of the lower insulating layer 23 and the upper insulating layer 25 are slightly smaller than that of the semiconductor layer 24. Here, the width relationships among the layers are not limited to the above-described example, and therefore, the widths of the lower insulating layer 23, the semiconductor layer 24, and the upper insulating layer 25 may be the same as each other. Alternatively, the width of the upper insulating layer 25 may be smaller than that of the strip conductor 26, further, the width of the lower insulating layer 23 may be greater than that of the semiconductor layer 24.

When a high frequency signal is transmitted in the above signal line 21, an electric field and a magnetic field are concentrated inside of the lower insulating layer 23, the semiconductor layer 24, and the upper insulating layer 25 between the strip conductor 26 and the base 22, and thus, the high frequency signal is transmitted along the signal line 21. In addition, the signal line 21 is formed into the island by removing the lower insulating layer 23, the semiconductor layer 24, and the upper insulating layer 25 around the strip conductor 26, and therefore, there is not a semiconductor layer but an air layer on both sides of the signal line 21. Consequently, an electromagnetic field generated between the strip conductor 26 and the base 22 can hardly pass the semiconductor layer 24 having a large loss, thereby reducing a loss. Additionally, a leak propagated through the semiconductor layer 24 can be reduced. As a consequence, it is possible to achieve excellent isolation characteristics of the signal line and excellent insertion loss characteristics at the time of the signal transmission.

(Manufacturing Method)

Next, explanation will be made on one example of a manufacturing method for the signal line 21. FIG. 3A shows an SOI (Silicon On Insulator) substrate, in which a second Si substrate is welded onto a first Si substrate while holding an oxide film ($SiO_2$ film) therebetween. The first Si substrate serves as the base 22; the oxide film, as the lower insulating layer 23; and the second Si substrate, as the semiconductor layer 24. As shown in FIG. 3B, a nitride film (SiN film) is formed as the upper insulating layer 25 on the semiconductor layer 24 (i.e., the second Si substrate) in the SOI substrate. Subsequently, a region serving as the signal transmission pathway is covered with a resist film, and then, the nitride film (upper insulating layer 25) not covered with the resist film is etched and removed. In this way, the upper insulating layer 25 is patterned in a belt manner along the signal transmission pathway, as shown in FIG. 3C. Thereafter, the resist film on the upper insulating layer 25 is peeled off.

After that, a Cr film is formed over the semiconductor layer 24 in such a manner as to cover the upper insulating layer 25 by vapor deposition, sputtering, or the like, and further, an Au film is formed over the Cr film. As shown in FIG. 3D, a metal film including Au (upper layer)/Cr (lower layer) is patterned in a strip manner, thereby forming the strip conductor 26 on the upper insulating layer 25.

Subsequently, a resist mask is formed in such a manner as to cover the upper insulating layer 25 and the strip conductor 26 or the upper insulating layer 25 is used as a mask, and then, an uncovered region of the semiconductor layer 24 is etched and removed, thereby forming the belt-like semiconductor layer 24 along the lower surface of the upper insulating layer 25, as shown in FIG. 3E. Moreover, the lower insulating layer 23 in a region uncovered with the semiconductor layer 24 is etched and removed while using the semiconductor layer 24 as a mask, and thus, the lower insulating layer 23 is formed in a belt manner, as shown in FIG. 3F.

(Two Signal Lines)

Figure 4A:
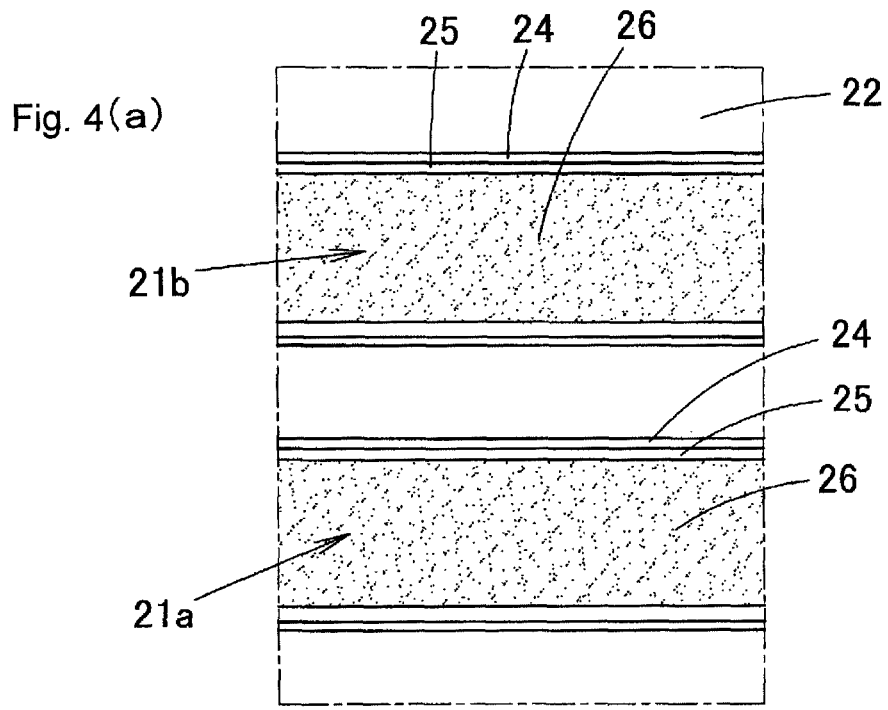
FIG. 4A is a plan view partly showing a signal line according to one or more embodiments of the present invention.
Figure 4B:
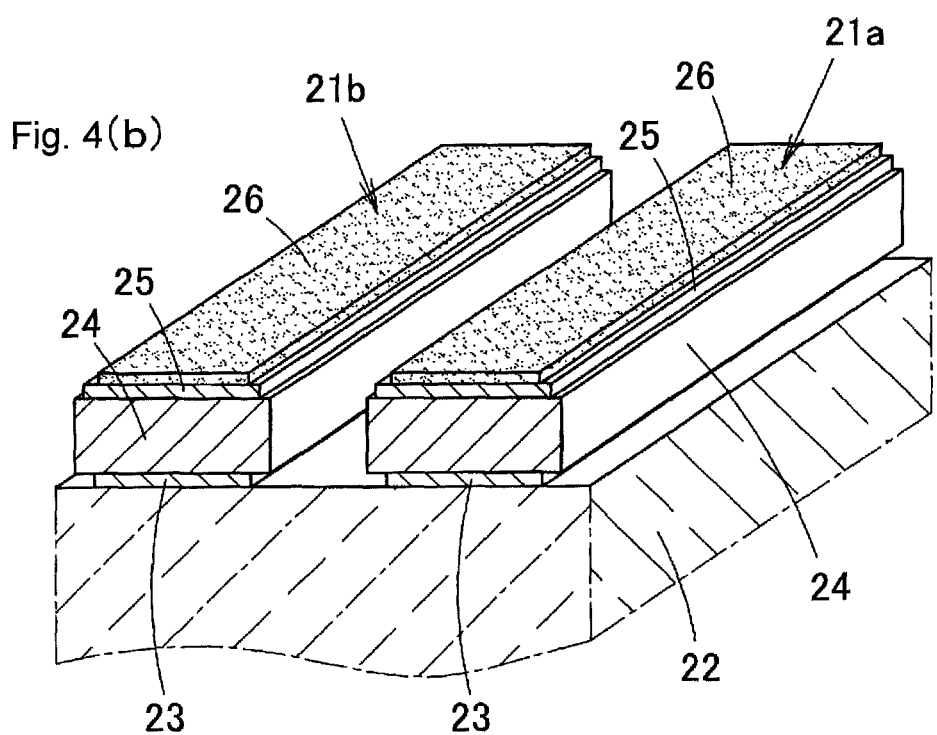
FIG. 4B is a perspective view showing the signal line according to one or more embodiments of the present invention.

FIGS. 4A and 4B show one or more embodiments, in which two signal lines 21a and 21b are juxtaposed in proximity with each other on the base 22. The signal lines 21a and 21b have the same structure as that of the signal line 21 while commonly using the base 22.

Figure 6:
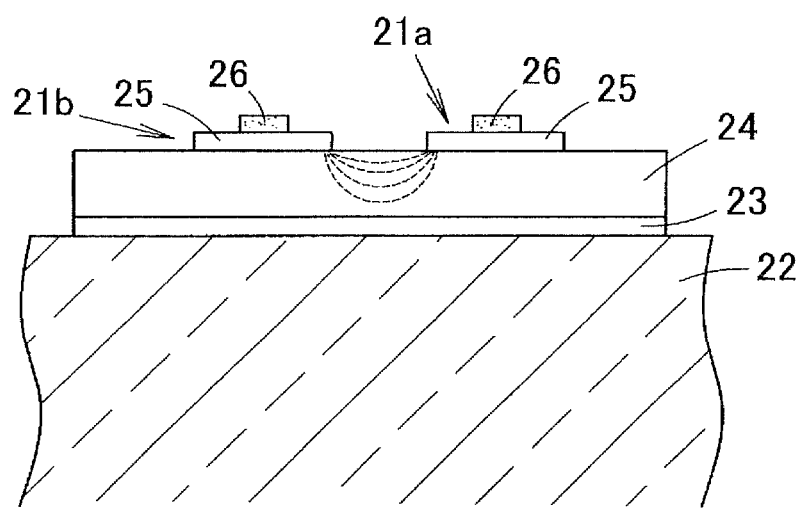
FIG. 6 is a cross-sectional view showing a signal line in a comparative example.

FIG. 6 is a cross-sectional view showing two signal lines that are not formed into islands in a comparative example. In the signal lines, an upper insulating layer 25 and a strip conductor 26 are laminated on a common semiconductor layer 24, thereby forming a signal line 21a. In the vicinity of the signal line 21a, another upper insulating layer 25 and another strip conductor 26 are laminated on the common semiconductor layer 24, thereby forming a signal line 21b. With this structure in the comparative example, the signal line 21a and the signal line 21b are coupled with each other through an electromagnetic field generated inside of the common semiconductor layer 24, as indicated by broken lines in FIG. 6. As a consequence, a leak occurs between the signal lines, thereby increasing an insertion loss and degrading isolation characteristics.

In contrast, the signal line 21a and the signal line 21b are independently formed into the islands in the signal line according to one or more embodiments of the present invention, as shown in FIG. 4B. Consequently, the signal line 21a and the signal line 21b are hardly coupled with each other, thus achieving excellent isolation characteristics. Moreover, the semiconductor layers 24 that cause a leak are separated from each other in as a small width as possible, thus reducing a transmission loss of each of the signal lines 21a and 21b so as to reduce an insertion loss at the time of the signal transmission.

(Manufacturing Method for Two Signal Lines)

FIGS. 5A to 5F are views illustrating one example of a manufacturing method for the two signal lines 21a and 21b, each having the island structure shown in FIGS. 4A and 4B. The manufacturing method for the signal lines 21a and 21b is substantially the same as that for the signal line 21 illustrated in FIGS. 3A to 3F. In other words, the signal line 21a and the signal line 21b are not independently manufactured, but they are manufactured at the same time, as shown in FIGS. 5A to 5F. Thus, the signal lines 21a and 21b can be manufactured with high efficiency.

(Electrostatic Relay)

Figure 7:
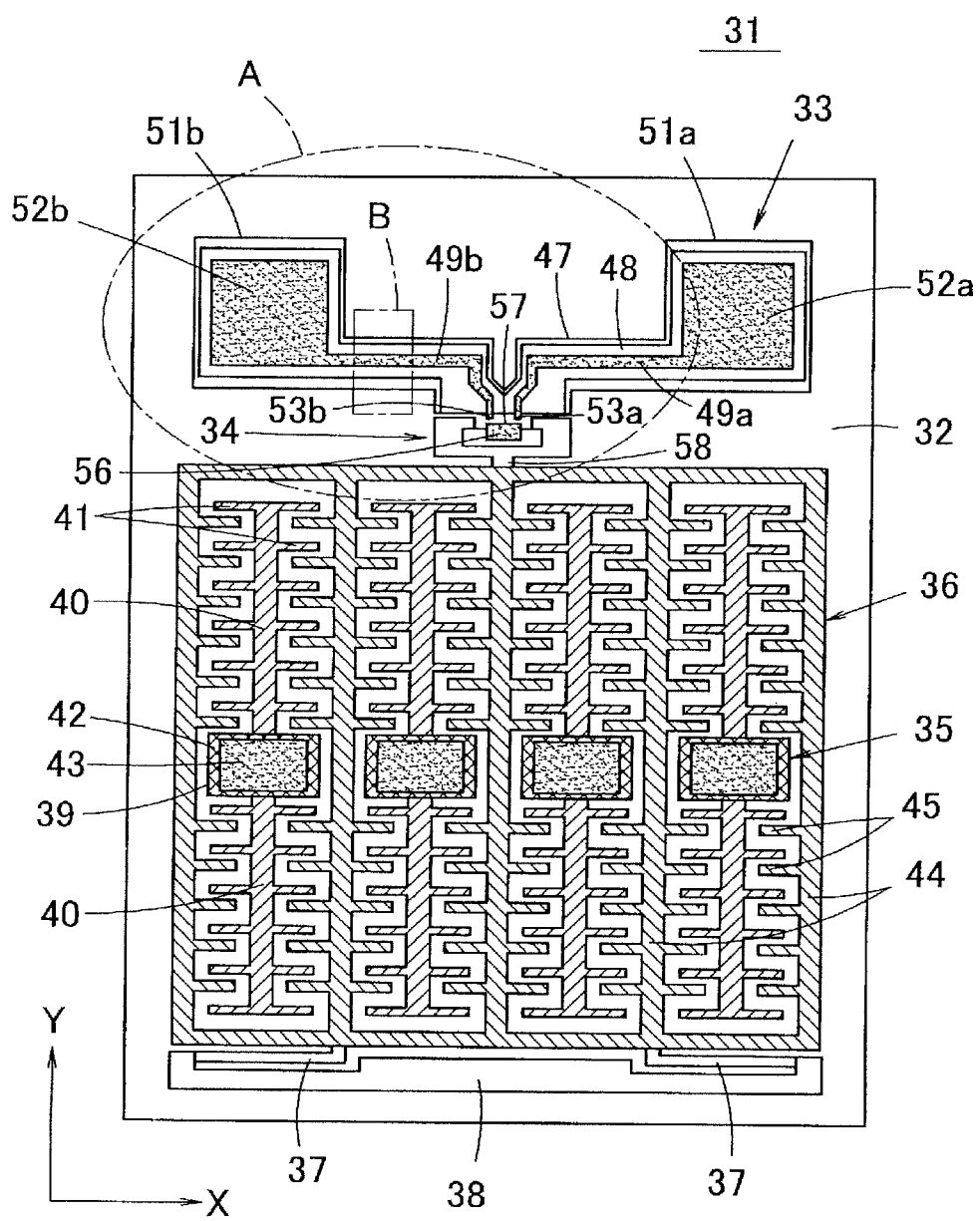
FIG. 7 is a plan view showing an electrostatic relay according to one or more embodiments of the present invention.
Figure 8:
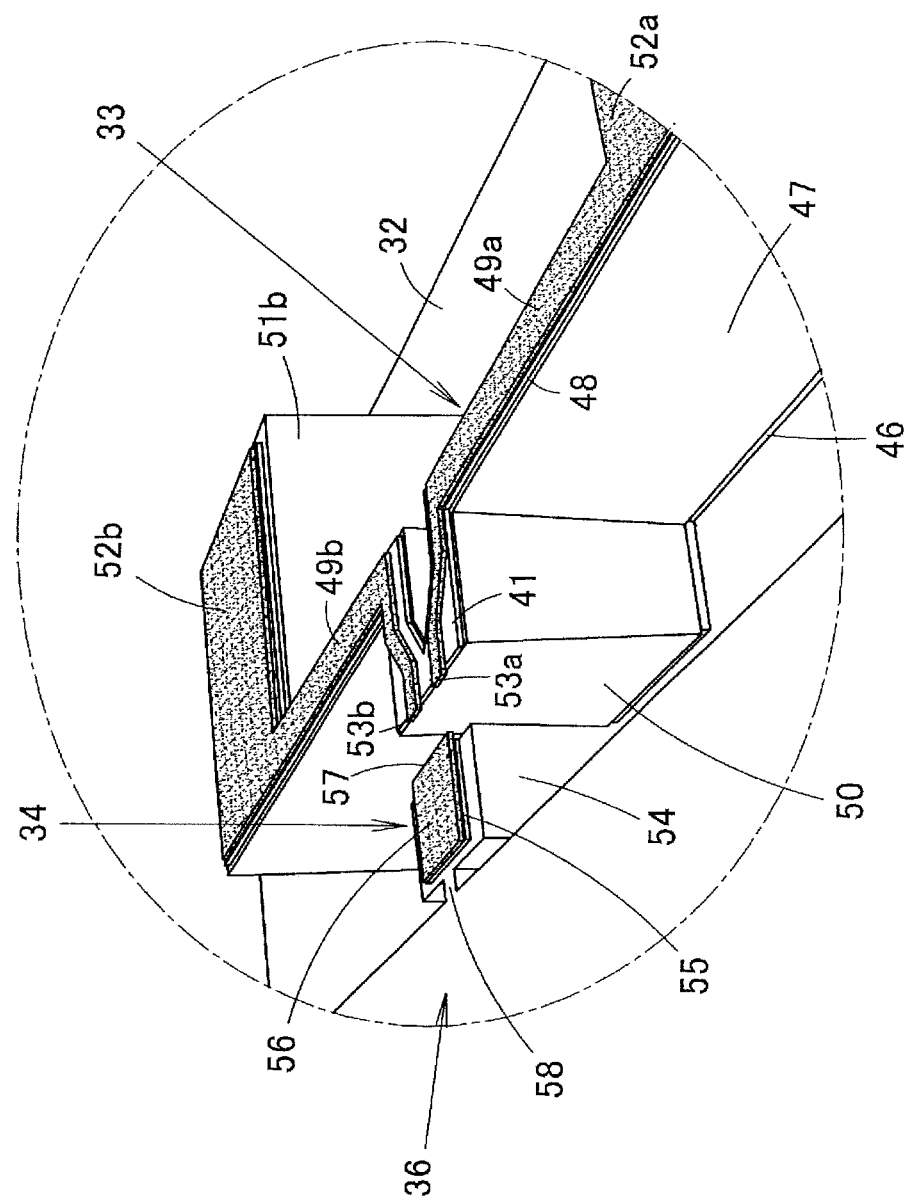
FIG. 8 is a perspective view showing a section A in FIG. 7 in enlargement.

FIG. 7 is a plan view showing the structure for a high frequency electrostatic relay 31 according to one or more embodiments of the present invention. FIG. 8 is a perspective view showing a section A in FIG. 7 in enlargement. In the electrostatic relay 31, the above signal line is used as a switch including a fixed contact unit and a movable contact unit.

In the electrostatic relay 31, a fixed contact unit 33, a movable contact unit 34, a fixed electrode unit 35, a movable electrode unit 36 supporting the movable contact unit 34, a resilient spring 37 that resiliently holds the movable electrode unit 36, and a supporter 38 are mounted on a base substrate 32 made of a conductive material such as an Si substrate or a metal substrate. In the electrostatic relay 31, the fixed contact unit 33 and the movable contact unit 34 constitute the switch whereas the fixed electrode unit 35, the movable electrode unit 36, and the like constitute an actuator. As described below, when the actuator is driven by an electrostatic force, the movable electrode unit 36 is moved in a direction parallel to the base substrate 32, so that the fixed contact unit 33 and the movable contact unit 34 are brought into contact with each other, thereby turning on the switch. To the contrary, when the electrostatic force is released, the resilient restorative force of the resilient spring 37 allows the movable electrode unit 36 to return to an original position, thereby turning off the switch.

The actuator for moving the movable contact unit 34 is constituted of the fixed electrode unit 35, the movable electrode unit 36, the resilient spring 37, and the supporter 38, and has a structure described below.

As shown in FIG. 7, the plurality of fixed electrode units 35, each of which is made of mainly conductive Si, are juxtaposed with each other on the base substrate 32. Each of the fixed electrode units 35 is fixed onto the base substrate 32 via an insulating film, not shown, made of $SiO_2$ or SiN. Branched electrode units 40 formed in a branched manner extend from both surfaces of a rectangular pad unit 39 in a Y direction in each of the fixed electrode units 35, as viewed in a direction perpendicular to the base substrate 32. Branches 41 project from the branched electrode unit 40 in a laterally symmetric manner. The branches 41 are arranged in a predetermined pitch in the Y direction. Here, the Y direction represents a direction parallel to the movement direction of the movable electrode unit 36 and the movable contact unit 34, as shown in FIG. 7: in contrast, an X direction represents a direction parallel to the upper surface of the base substrate 32 and perpendicular to the Y direction. The pad unit 39 includes an electrode pad layer 43 on an electrode film 42.

The movable electrode unit 36 is made of conductive Si, and is formed in such a manner as to surround the fixed electrode units 35. Toothcomb electrode units 44 are formed in the movable electrode unit 36 in such a manner as to hold each of the fixed electrode units 35 therebetween (a pair of toothcomb electrode units 44 forms a branch between the fixed electrode units 35). The toothcomb electrode units 44 are laterally symmetric with each other with respect to the fixed electrode unit 35. A toothcomb 45 extends from each of the toothcomb electrode units 44 toward a clearance defined between the branches 41. Moreover, a distance between each of the toothcombs 45 and the branch 41 positioned nearer the movable contact unit 34 adjacently to the toothcomb 45 is smaller than that between the toothcomb 45 and the branch 41 positioned apart from the movable contact unit 34 adjacently to the toothcomb 45.

The supporter 38 is fixed onto the upper surface of the base substrate 32 via an insulating film, not shown, and extends longer in the X direction at one end of the base substrate 32. Both ends of the supporter 38 and the movable electrode unit 36 are connected to each other via the pair of resilient springs 37. The movable electrode unit 36 is horizontally supported by the supporter 38 via the resilient springs 37, and then, is slightly floated from the upper surface of the base substrate 32. Therefore, the movable electrode unit 36 can be moved in the Y direction by resiliently deforming the resilient springs 37. Here, the resilient spring 37 and the supporter 38 are made of Si.

The actuator having the above-described structure is driven in the following manner. A DC voltage source is connected between the fixed electrode unit 35 and the movable electrode unit 36, and then, a DC voltage is turned on or off by a control circuit or the like. In the fixed electrode unit 35, one terminal of the DC voltage source is connected to the electrode pad layer 43: in contrast, the other terminal of the DC voltage source is connected to, for example, the supporter 38. The supporter 38 and the resilient spring 37 have conductivity, and further, the supporter 38, the resilient spring 37 and the movable electrode unit 36 are electrically conducted. Therefore, the voltage applied to the supporter 38 is applied to the movable electrode unit 36.

When the DC voltage is applied between the fixed electrode unit 35 and the movable electrode unit 36 from the DC voltage source, an electrostatic attractive force is generated between the branch 41 of the branched electrode unit 40 and the toothcomb 45 of the toothcomb electrode unit 44. However, the structure for the fixed electrode unit 35 and the movable electrode unit 36 is formed symmetrical with respect to the center line of each of the fixed electrode units 35, and therefore, the electrostatic attractive forces exerting on the movable electrode unit 36 in the X direction are balanced, so that the movable electrode unit 36 cannot be moved in the X direction. In the meantime, the distance between each of the toothcombs 45 and the branch 41 located near the movable contact unit 34 is shorter than that between the toothcomb 45 and the branch 41 located apart from the movable contact unit 34, and therefore, each of the toothcombs 45 is attracted toward the movable contact unit. Thus, the resilient spring 37 is flexed while the movable electrode unit 36 is moved toward the fixed contact unit 33.

When the DC voltage applied between the fixed electrode unit 35 and the movable electrode unit 36 is released, the electrostatic attractive force generated between the branch 41 and the toothcomb 45 is dissipated, and therefore, the movable electrode unit 36 is retreated apart from the fixed contact unit 33 by the resilient restorative force of the resilient spring 37.

Next, explanation will be made on the structure for the switch including the fixed contact unit 33 and the movable contact unit 34. As shown in FIG. 8, a fixed contact substrate 47 (semiconductor layer) made of insulating or semi-insulating Si is disposed in the fixed contact unit 33 with its lower surface securely mounted on the upper surface of the base substrate 32 via an insulating film 46 made of $SiO_2$ or SiN. An insulating layer 48 made of SiN or $SiO_2$ is formed on the fixed contact substrate 47. Moreover, as shown in FIGS. 7 and 8, the fixed contact substrate 47 extends in the widthwise direction (X direction) at the upper end of the base substrate 32, has an expansion 50 expanding toward the movable contact unit 34 at the center thereof, and has pad supporters 51a and 51b at both ends thereof.

A conductive layer made of Au (upper layer)/Cr (lower layer), Pt, Au, Pd, Ir, Ru, Rh, Re, Ta, a Pt alloy, an Au alloy, or the like is formed on the insulating layer 48. The conductive layer serves as contact pads 52a and 52b on the pad supporters 51a and 51b whereas as fixed contacts 53a and 53b juxtaposed with each other on the expansion 50 and extending toward the movable contact unit 34. The conductive layer connecting the contact pad 52a and the fixed contact 53a serves as a strip conductor 49a: in contrast, the conductive layer connecting the contact pad 52b and the fixed contact 53b serves as a strip conductor 49b.

The movable contact unit 34 is located at a position facing the expansion 50. The movable contact unit 34 has an insulating layer 55 made of SiN or $SiO_2$ formed on a movable contact substrate 54 made of insulating or semi-insulating Si and a conductive layer 56 made of Au (upper layer)/Cr (lower layer), Pt, Au, Pd, Ir, Ru, Rh, Re, Ta, a Pt alloy, an Au alloy, or the like and formed on the insulating layer 55, as shown in FIG. 8. The end of the conductive layer 56, facing the fixed contacts 53a and 53b projects beyond the front surface of the movable contact substrate 54, and serves as a movable contact 57. The movable contact substrate 54 is supported in a cantilever manner by a support beam 58 projecting from the movable electrode unit 36.

In the above electrostatic relay 31, a high frequency circuit, not shown, is connected to the contact pads 52a and 52b in the fixed contact unit 33. The movable contact unit 34 is driven by the actuator, and further, the movable contact 57 is brought into contact with the fixed contacts 46a and 46b, thereby closing the high frequency circuit. When the high frequency circuit is closed, a high frequency signal flows from the strip conductor 49a to the other strip conductor 49b through the insulating layer 55 in the movable contact unit 34. Moreover, the movable contact unit 34 is retreated by the resilient restorative force of the resilient spring 37 by releasing the electrostatic force of the actuator, and then, the movable contact 57 is separated from the fixed contacts 46a and 46b, thereby opening the high frequency circuit.

In a section, in which the strip conductor 49a or 49b in the fixed contact unit 33 is wired (e.g., a section B in FIG. 7), in the electrostatic relay 31, the widths of the insulating film 46, fixed contact substrate 47, and insulating layer 48 are substantially equal to the line width of the strip conductor 49a or 49b, so that the fixed contact unit 33 is formed into an island, thereby configuring the signal line 21 shown in FIGS. 2A and 2B. Specifically, the base substrate 32, the insulating film 46, the fixed contact substrate 47, the insulating layer 48, and the strip conductors 49a and 49b correspond to the base 22, the lower insulating layer 23, the semiconductor layer 24, the upper insulating layer 25, and the strip conductor 26 in the signal line 21 shown in FIGS. 2A and 2B, respectively.

As a consequence, the leaks of the high frequency signals from the strip conductors 49a and 49b can be reduced so as to achieve the excellent isolation characteristics and reduce an insertion loss in the switch section in the electrostatic relay 31 using the structure for the signal line according to one or more embodiments of the present invention.

Incidentally, in the movable contact unit 34 shown in FIG. 7, the two conductive layers are juxtaposed with each other at the tips of the conductor layers, that is, the fixed contacts 53a and 53b. Therefore, the fixed contacts 53a and 53b may be configured as the two signal lines 21a and 21b shown in FIGS. 4A and 4B.

(Simulation Results of Isolation and Insertion Loss)

Figure 11A:
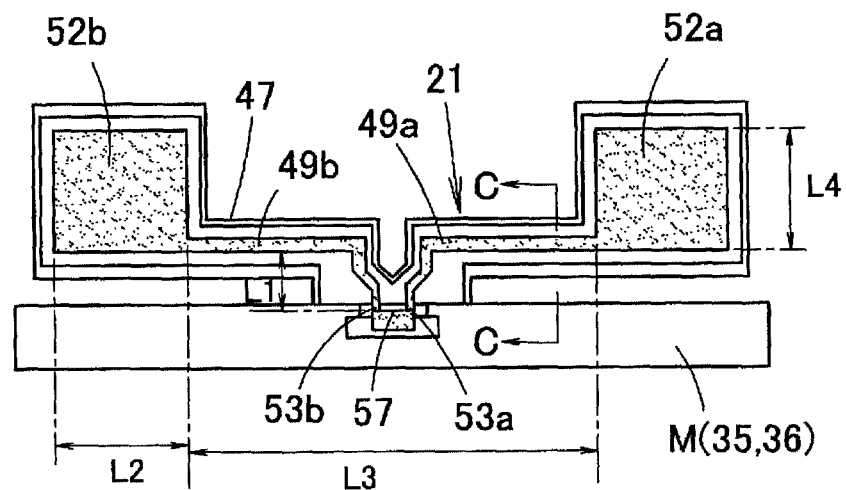
FIG. 11A is a plan view showing a simulation model of the switch in the example according to one or more embodiments of the present invention, for use in obtaining the results illustrated in FIGS. 9 and 10.
Figure 11B:
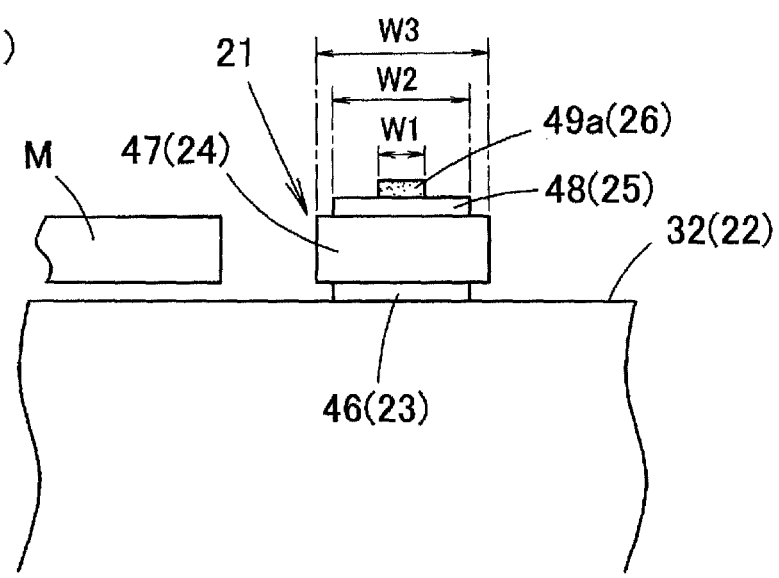
FIG. 11B is a cross-sectional view taken along line C-C of FIG. 11A.
Figure 12A:
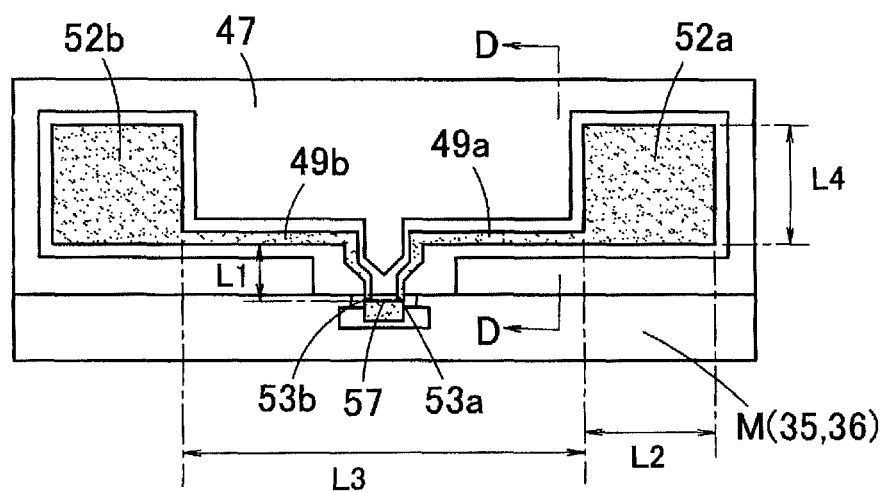
FIG. 12A is a plan view showing a simulation model of the switch in the comparative example, for use in obtaining the results illustrated in FIGS. 9 and 10.
Figure 12B:
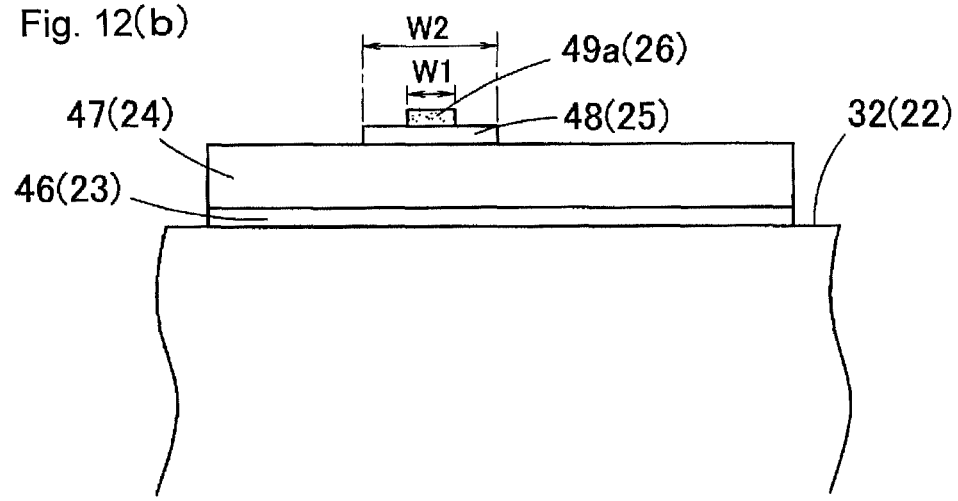
FIG. 12B is a cross-sectional view taken along line D-D of FIG. 12A.

Isolation characteristics and frequency characteristics of an insertion loss between an input and an output are simulated by using a model of an electrostatic relay in an example according to one or more embodiments of the present invention shown in FIGS. 11A and 11B and a model of an electrostatic relay in a comparative example shown in FIGS. 12A and 12B.

In the model of the electrostatic relay (using the signal line having the island structure) in the example according to one or more embodiments of the present invention shown in FIGS. 11A and 11B, the width L2 of the contact pad 52a or 52b is 100 µm and its length L4 also is 100 µm. The distance L3 between the contact pad 52a and the contact pad 52b is 300 µm. Moreover, the distance L1 from the edge of the strip conductor 49a or 49b to the tip of the fixed contact 53a or 53b is 37 µm. Additionally, the line width W1 of the strip conductor 49b (strip conductor 26) is 10 µm; the width W2 of each of the insulating layer 48 (upper insulating layer 25) and the insulating film 46 (lower insulating layer 23) is 30 µm; and the width W3 of the fixed contact substrate 47 (semiconductor layer 24) is 40 µm.

Similarly, also in the model of the electrostatic relay (using a signal line not having an island structure) in the comparative example shown in FIGS. 12A and 12B, the width L2 of the contact pad 52a or 52b is 100 µm and its length L4 also is 100 µm. The distance L3 between the contact pad 52a and the contact pad 52b is 300 µm. Moreover, the distance L1 from the edge of the strip conductor 49a or 49b to the tip of the fixed contact 53a or 53b is 37 µm. Additionally, the line width W1 of the strip conductor 49b (strip conductor 26) is 10 µm; and the width W2 of each of the strip conductor 49b (upper insulating layer 25) and the insulating film 46 (lower insulating layer 23) is 30 µm. Here, the size of the fixed contact substrate 47 (semiconductor layer 24) is sufficiently great in the comparative example.

Incidentally, the influence by the presence of the actuator including the fixed electrode unit 35 and the movable electrode unit 36 in the vicinity is evaluated by replacing the actuator with a rectangular semiconductor block M, as shown in FIGS. 11A and 12A.

Figure 9:
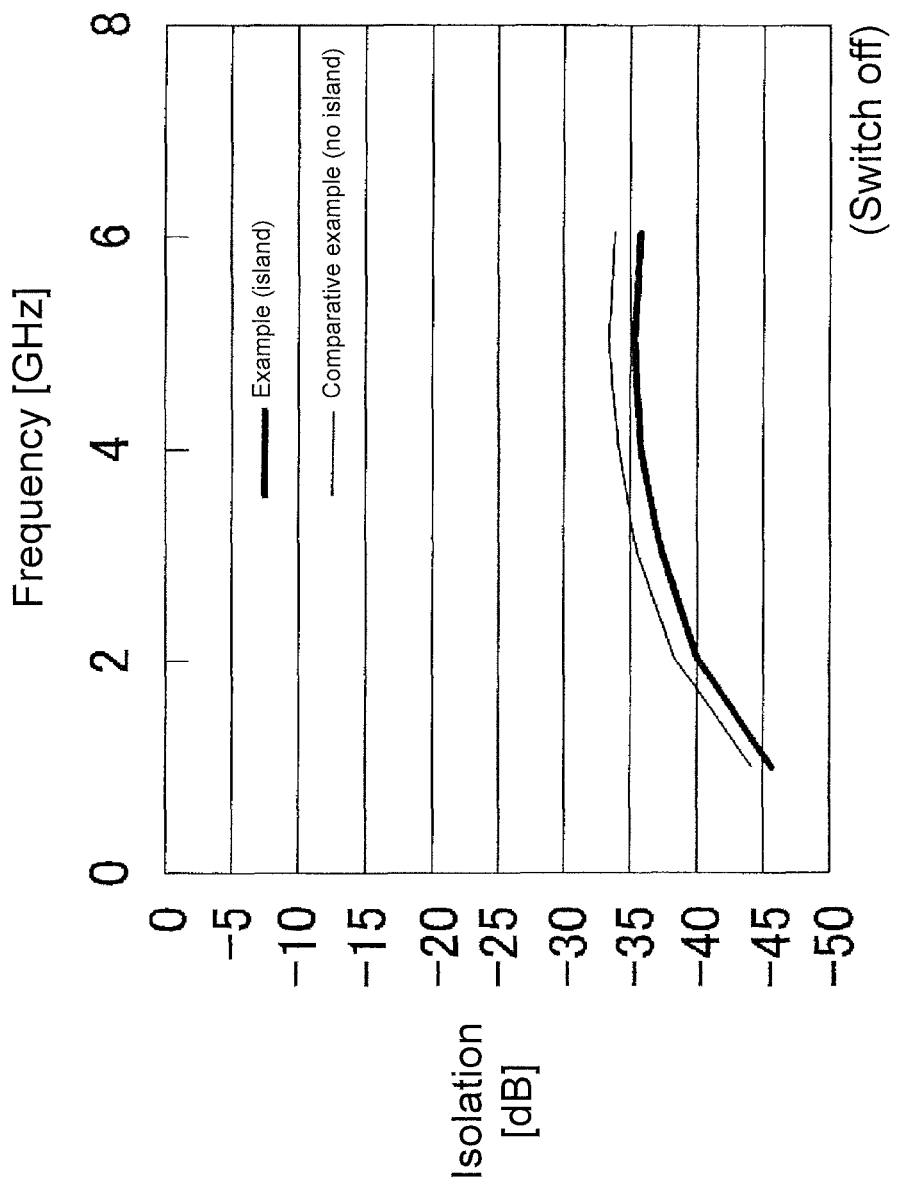
FIG. 9 is a graph illustrating isolation characteristics at the time of switch off in a switch in an example according to one or more embodiments of the present invention (using a signal line having an island structure) and in a switch in the comparative example (using a signal line not having an island structure).

FIG. 9 illustrates evaluation results of the isolation characteristics between the input and the output in a GHz band by using the model in the example shown in FIGS. 11A and 11B and the model in the comparative example shown in FIGS. 12A and 12B. The isolation is determined in the state in which the movable contact unit 34 is retreated so that the tips of the fixed contacts 53a and 53b are separated from the movable contact 57 of the movable contact unit 34 (switch off state), as shown in FIG. 13A. Assuming that when a high frequency signal having a power value Pin is input into the contact pad 52a, a high frequency signal output from the other contact pad 52b has a power value Pout, the isolation is determined as follows:

$$10 \times \log_{10}(\text{Pout}/\text{Pin})[\text{dB}]$$

In the case where the signal is fully leaked from the input to the output irrespective of the switch off, the isolation is 0 dB. In contrast, as the leak of the signal between the input and the output becomes smaller, the power value Pout on the output side becomes smaller, therefore, the isolation is expressed by a negative value and a large absolute value. Accordingly, in FIG. 9, the smaller the value is, the more excellent the isolation is.

In FIG. 9, the simulation result in the example is lower than that in the comparative example. In other words, it is found that the leak of the high frequency signal between the input and the output is more reduced in the model in the example using the signal line having the island structure, and therefore, that the isolation characteristics are excellent.

Figure 10:
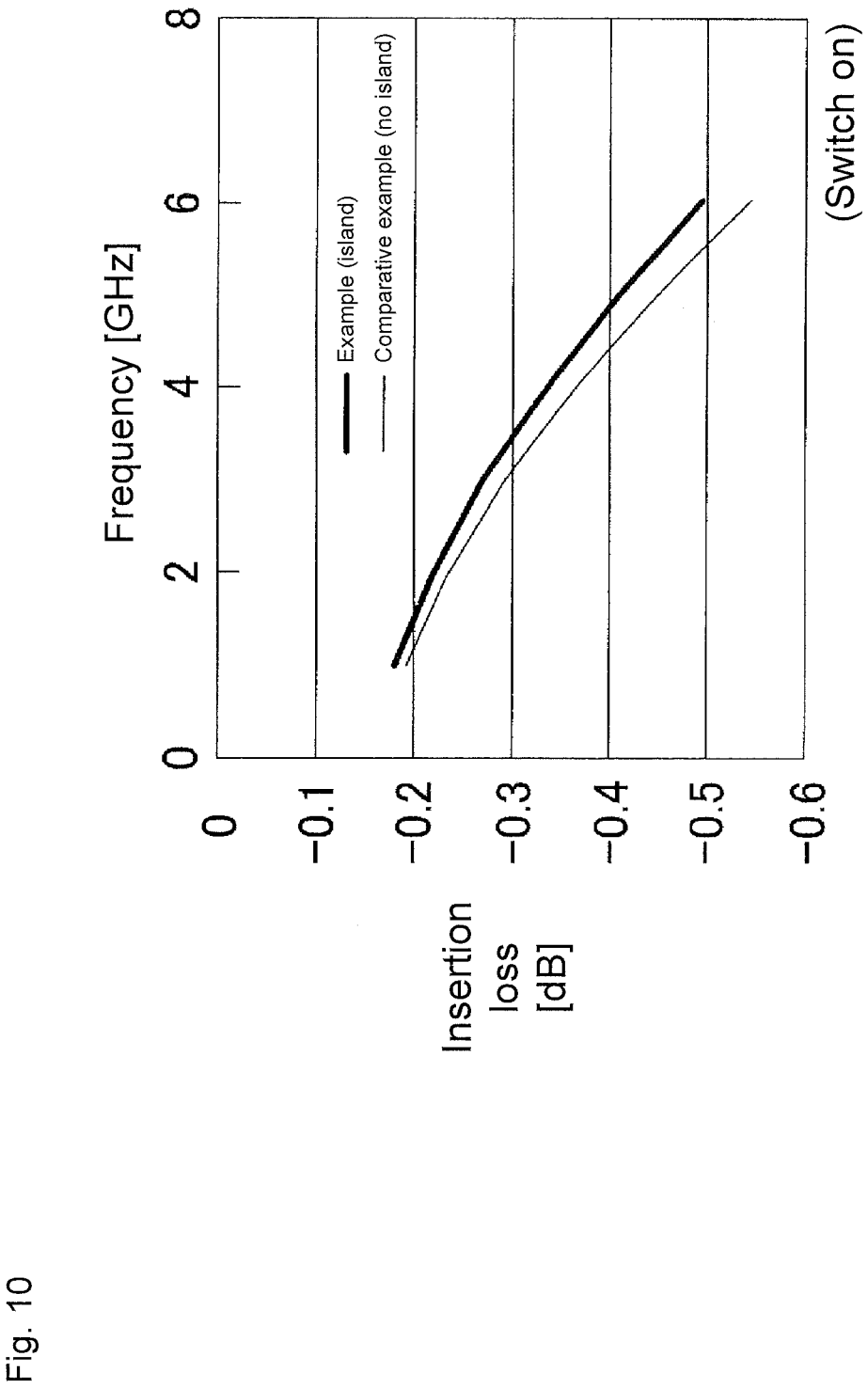
FIG. 10 is a graph illustrating frequency characteristics of an insertion loss at the time of switch on in the switch in the example according to one or more embodiments of the present invention and in the switch in the comparative example.

FIG. 10 illustrates evaluation results of the frequency characteristics of the insertion loss between the input and the output in the GHz band by using the model in the example shown in FIGS. 11A and 11B and the model in the comparative example shown in FIGS. 12A and 12B. The insertion loss is determined in the state in which the movable contact unit 34 is advanced so that the tips of the fixed contacts 53a and 53b are brought into contact with the movable contact 57 of the movable contact unit 34 (switch on state), as shown in FIG. 13B. Assuming that when the high frequency signal having the power value Pin is input into the contact pad 52a, the high frequency signal output from the other contact pad 52b has the power value Pout, the insertion loss is determined as follows:

$$10 \times \log_{10}(\text{Pout}/\text{Pin})[\text{dB}]$$

In the case where the high frequency signal is leaked to the outside, and therefore, is hardly transmitted from the input to the output, the value Pout is small. Therefore, the insertion loss is expressed by a negative value and a large absolute value. Moreover, as the leak of the high frequency signal becomes smaller, the value Pout approaches the value Pin. Therefore, the value of the insertion loss approaches 0 dB. Accordingly, in FIG. 10, the greater the value is, the smaller the insertion loss is.

In FIG. 10, the simulation result in the example appears above that in the comparative example. In other words, it is found that the leak of the high frequency signal is more reduced in the example using the signal line having the island structure, and therefore, that the insertion loss also is reduced. While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

Description Of Symbols 21, 21a, 21b signal line; 22 base; 23 lower insulating layer; 24 semiconductor layer; 25 upper insulating layer; 26 strip conductor; 31 electrostatic relay; 32 base substrate; 33 fixed contact unit; 34 movable contact unit; 35 fixed electrode unit; 36 movable electrode unit; 37 resilient spring; 46 insulating film; 47 fixed contact substrate; 48 insulating layer; 49a, 49b strip conductor; 53a, 53b fixed contact; 57 movable contact

The invention claimed is:

1. A manufacturing method for a signal line comprising the steps of:
 forming a second insulating layer at an upper surface of a second semiconductor substrate in an SOI substrate in which a first semiconductor substrate and the second semiconductor substrate are welded while holding a first insulating layer therebetween;
 patterning the second insulating layer in a band manner to form an upper insulating layer for a signal line;
 manufacturing a strip conductor for a signal line along the upper insulating layer at an upper surface of the upper insulating layer;
 etching and removing the second semiconductor substrate in a region exposed to the outside from the upper insulating layer to form a semiconductor layer for a signal line with the second semiconductor substrate; and
 etching and removing the first insulating layer in a region exposed to the outside from the semiconductor layer to form a lower insulating layer for a signal line with the first insulating layer at an upper surface of a base for the signal line including the first semiconductor substrate.

2. A switch comprising:
 a structure for a signal line, the signal line comprising:
  a base;
  a lower insulating layer formed at an upper surface of the base;
  a semiconductor layer disposed along a pathway at an upper surface of the lower insulating layer, at least a part of the semiconductor layer configured to transmit a signal;
  an upper insulating layer formed at an upper surface of the semiconductor layer, at least a part of the upper insulating layer being mounted along the semiconductor layer; and
  a strip conductor formed at an upper surface of the upper insulating layer, at least
  a part of the strip conductor being mounted along the upper insulating layer,
 wherein the structure for the signal line is as at least one pair of contacts that are brought into contact with or separated from each other and at least a part of a pathway for a signal flowing in the contacts.

3. The switch according to claim 2,
 wherein a plurality of the signal lines, each having the lower insulating layer, the semiconductor layer, the upper insulating layer, and the strip conductor, are mounted on the base that is commonly used, and
 wherein in the plurality of signal lines, at least parts of the semiconductor layers are separated from each other;
 wherein at least parts of the upper insulating layers are separated from each other; and
 wherein at least parts of the strip conductors are separated from each other.

* * * * *